US006307302B1

(12) United States Patent
Toda

(10) Patent No.: US 6,307,302 B1
(45) Date of Patent: Oct. 23, 2001

(54) ULTRASONIC TRANSDUCER HAVING IMPEDANCE MATCHING LAYER

(75) Inventor: Minoru Toda, Lawrenceville, NJ (US)

(73) Assignee: Measurement Specialities, Inc.

( * ) Notice: Subject to any disclaimer, the term of this patent is extended or adjusted under 35 U.S.C. 154(b) by 0 days.

(21) Appl. No.: 09/360,305

(22) Filed: Jul. 23, 1999

(51) Int. Cl.[7] .................................................... H01L 41/08
(52) U.S. Cl. ............................................ 310/334; 310/327
(58) Field of Search .................................... 310/334–337, 310/326, 327

(56) References Cited

U.S. PATENT DOCUMENTS

| | | | | |
|---|---|---|---|---|
| 2,803,129 | * | 8/1957 | Bradfield | 310/327 X |
| 3,925,692 | * | 12/1975 | Leschek et al. | 310/327 |
| 3,935,484 | * | 1/1976 | Leschek et al. | 310/327 |
| 4,166,967 | * | 9/1979 | Benes et al. | 310/334 X |
| 4,211,949 | * | 7/1980 | Brisken | 310/334 X |
| 4,578,611 | * | 3/1986 | Sadler | 310/227 X |
| 4,771,205 | * | 9/1988 | Mequio | 310/334 |
| 5,329,682 | * | 7/1994 | Thurn et al. | 310/334 |
| 5,332,943 | * | 7/1994 | Bhardwaj | 310/327 X |
| 5,541,468 | * | 7/1996 | Frey et al. | 310/334 |

* cited by examiner

*Primary Examiner*—Mark O. Budd
(74) *Attorney, Agent, or Firm*—Duane Morris

(57) ABSTRACT

A resonant-type transducer providing a narrow band, high output or high sensitivity signal to a radiation medium, the resonant transducer comprising a vibrator body comprising piezoelectric or electrorestricitive material having a first acoustic impedance at a resonant condition, and a matching layer for acoustically matching the piezoelectric vibrator body at resonance to the radiation medium. Another type of a matching layer structure comprising a first layer of material of a first thickness $t_1$ and acoustic impedance Z1 and having an inner surface coupled to a front surface of the vibrator body, and a second layer of material of thickness $t_2$ and acoustic impedance Z2 and having an outer surface coupled to the radiation medium wherein the second layer has a high acoustic impedance relative to the first layer and wherein the second layer has a thickness of less than one quarter wavelength of the resonant frequency so as to cause a reflection from the high impedance layer to provide a combined impedance of the matching layer at the front surface of the vibrator body which is less than the acoustic impedance of the radiation medium. These matching layer structures provide increased output power and also higher receiving sensitivity for resonant type transducers.

32 Claims, 14 Drawing Sheets

ULTRASONIC TRANSDUCER HAVING IMPEDANCE MATCHING LAYER

FIELD OF THE INVENTION

This invention relates to ultrasonic transducers, and more particularly to ultrasonic transducers having improved coupling of ultrasonic energy to a transmission medium.

BACKGROUND OF THE INVENTION

It is well known that high frequency ultrasonic waves may be generated or received by piezoelectric or electrostrictive transducers operating in thickness vibration mode. Typically, one of two kinds of ultrasonic waves are used. The a first type is termed pulse and the second is called continuous wave. Because the spectrum of a pulse covers a broad frequency range, the former requires a broad band frequency response. The latter (i.e. continuous wave) can be of narrow frequency response. When resonance of a transducer is strong, the bandwidth is relatively narrow. Therefore, resonant transducers are generally not suitable for generation of a sharp pulse. When continuous wave is required, a resonant type transducer is suitable and the bandwidth can be narrow. Furthermore, a resonant type transducer can generate a high output power acoustic signal which is typically higher than that of non-resonant transducers. Also, resonant type transducers receive ultrasonic waves with a high degree of sensitivity and can generate a voltage output in response thereto.

There are various applications of high frequency ultrasound in continuous wave mode. Examples include (1) blood flow velocity measurement using Doppler shift, (2) liquid flow velocity measurement using phase differences between up-stream and down stream signals, (3) image formation using intensity of reflection from an object using a scanned focused beam, (4) distance measurement for varying reflector position from varying transducer impedance due to varying phase of reflection, and (5) ultrasound focused energy to ablate malignant organs such as prostate cancer or tumors (i.e. operations without cutting the skin).

In order to improve performance of an ultrasonic transducer, an impedance matching layer is often added at the front surface of the transducer. For instance, it is known in the art to have an impedance matching layer with a thickness of a quarter wavelength bonded at the front surface of a transducer. Also, conventional practice has implemented the theory that the best impedance matching is obtained at the condition of its acoustic impedance of geometrical mean value of the impedances of transducer material and radiation medium. Consistent with conventional practice, such a matching layer is obtained having an acoustic impedance value between a high impedance value associated with the transducer material, and a low impedance value corresponding to the radiation or propagation medium (typically, water).

Furthermore, it is generally known that a front matching layer added to a resonant type transducer makes the transducer wide band and higher output (receiving sensitivity). As evidenced through published articles and issued patents, such as U.S. Pat. Nos. 4,507,582, 4,211,948, and 4,672,591 suggesting that the best matching layer necessarily increases output or sensitivity of the transducer. This is because there is a common knowledge on electric power output, which is maximized when the load impedance is matched to the source impedance.

In the case of an ultrasonic transducer, the conventional impedance matching condition is the geometrical average of impedances of radiation medium and transducer material; where:

$$Z_m=\sqrt{Z_P Z_R} \qquad \text{(Eq.1)}$$

$Z_m=p_m V_m$; Matching layer impedance (p; density, V; velocity)

$Z_R=p_R V_R$; Radiation medium impedance (p; density, V; velocity)

$Z_p=p_p V_p$; Piezo material impedance (p; density, V; velocity) where $Z_p>Z_R$ and $Z_p>Z_m>Z_R$, and the values of Z of these materials are determined in their natural state.

However, in accordance with the present invention as described herein, it has been determined that a resonant type transducer is different from a non-resonant transducer. In non-resonant transducers, the best matching structure is shown by Eq. (1) which operates to make the bandwidth narrower and output (sensitivity) higher. In resonant transducers, the conventional matching condition—satisfying Eq. (1); i.e. geometric average using matching layer with impedance greater than water and less than the determined high impedance of the piezo material transducer body—makes the bandwidth broader but the output (sensitivity) lower. Therefore, there is no advantage of the conventional matching layer for resonant transducers. The present invention proposes that the impedance of the matching layer should be much lower than the value provided by the conventional matching condition of Eq. (1) in order to improve output or receiver sensitivity.

Accordingly, while a matching condition wherein the matching layer impedance lies between a high impedance transducer material and a low impedance radiation medium (e.g. water) is acceptable for wideband matching, its application to high output or high sensitivity transducer applications (e.g. an acoustic surgical knife) is less than desirable. Therefore, a matching structure for coupling a transducer body to a radiation medium for providing a high output or high sensitivity ultrasound acoustic signal is greatly desired.

SUMMARY OF THE INVENTION

A resonant type transducer comprising a vibrator body comprising piezoelectric or electrostrictive material having a first acoustic impedance at a resonant condition; a matching layer coupled to the vibrator body and having a second acoustic impedance; the matching layer acoustically matching the piezoelectric vibrator to a radiation medium contacting the matching layer, the radiation medium having a third acoustic impedance, wherein the second acoustic impedance associated with the matching layer is less than the third acoustic impedance associated with the radiation medium.

A resonant type transducer providing a narrowband, high output or high receiver sensitivity signal to a radiation medium, the resonant transducer comprising a vibrator body comprising piezoelectric material having a first acoustic impedance at a resonant condition and a matching layer for acoustically matching said vibrator body at resonance to the radiation medium, the matching layer comprising a first layer of material of thickness t1 and acoustic impedance Z1 and having an inner surface coupled to a front surface of said vibrator body; and a second layer of material of thickness t2 and acoustic impedance Z2 and having an outer surface coupled to the radiation medium, wherein the acoustic impedance Z2 is greater than the first acoustic impedance Z1 so as to provide a combined impedance of the matching layer at the front surface of the vibrator body which is less than the acoustic impedance of the radiation medium.

A method of forming a resonance transducer comprising providing a piezoelectric body having a first acoustic impedance at a non-resonant condition providing a propagation medium having a second acoustic impedance less than the first acoustic impedance and coupling a matching layer between the piezoelectric body and the propagation medium, wherein the piezoelectric body vibrating at the resonance frequency has a resonance impedance less than the second acoustic impedance associated with the propagation medium, and wherein the matching layer has a third acoustic impedance less than the second acoustic impedance associated with the propagation medium for providing a high output or high receiving sensitivity signal to the medium when operated at the resonance frequency.

Figure 6A:
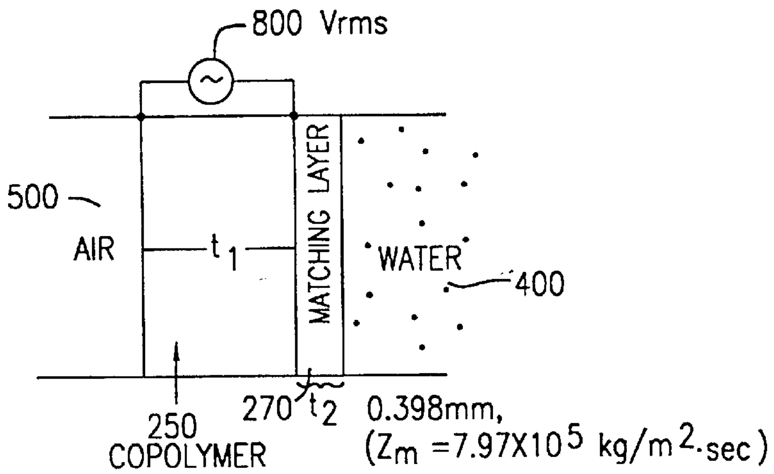
FIG. 6A is a schematic cross-sectional view of an ultrasonic transducer utilizing a layer of copolymer for generating an acoustic wave into a transmission medium via a matching layer having impedance characteristics in accordance with an embodiment of the present invention.
Figure 7A:
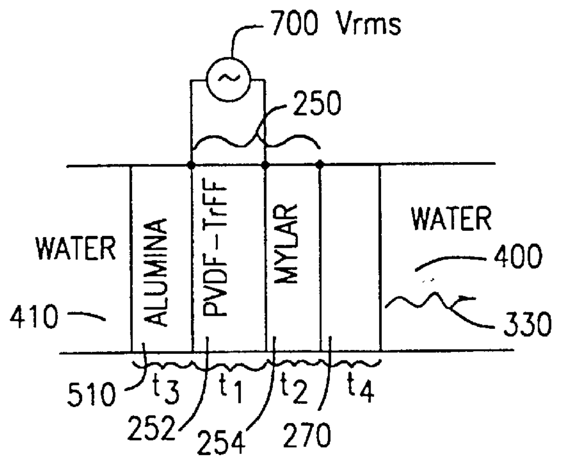
Figure 7B:
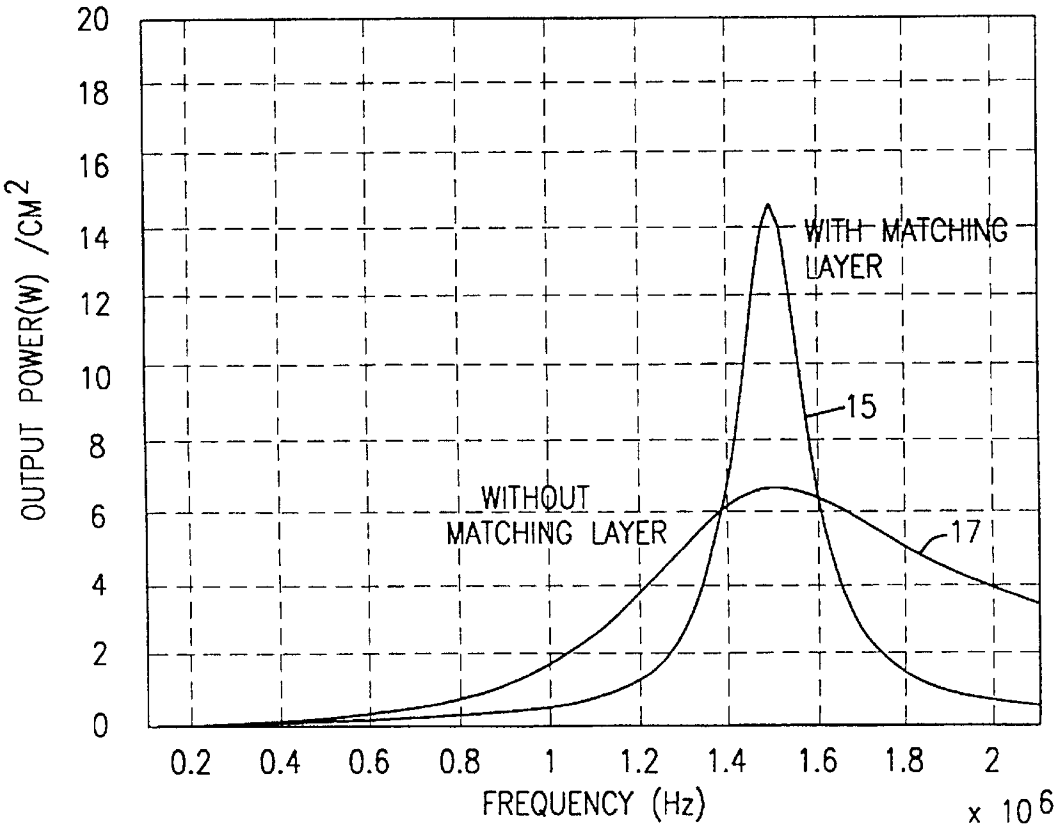
Figure 8A:
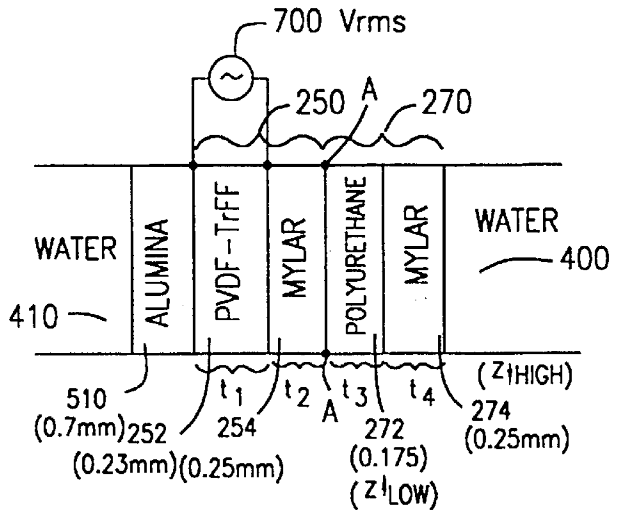
Figure 8B:
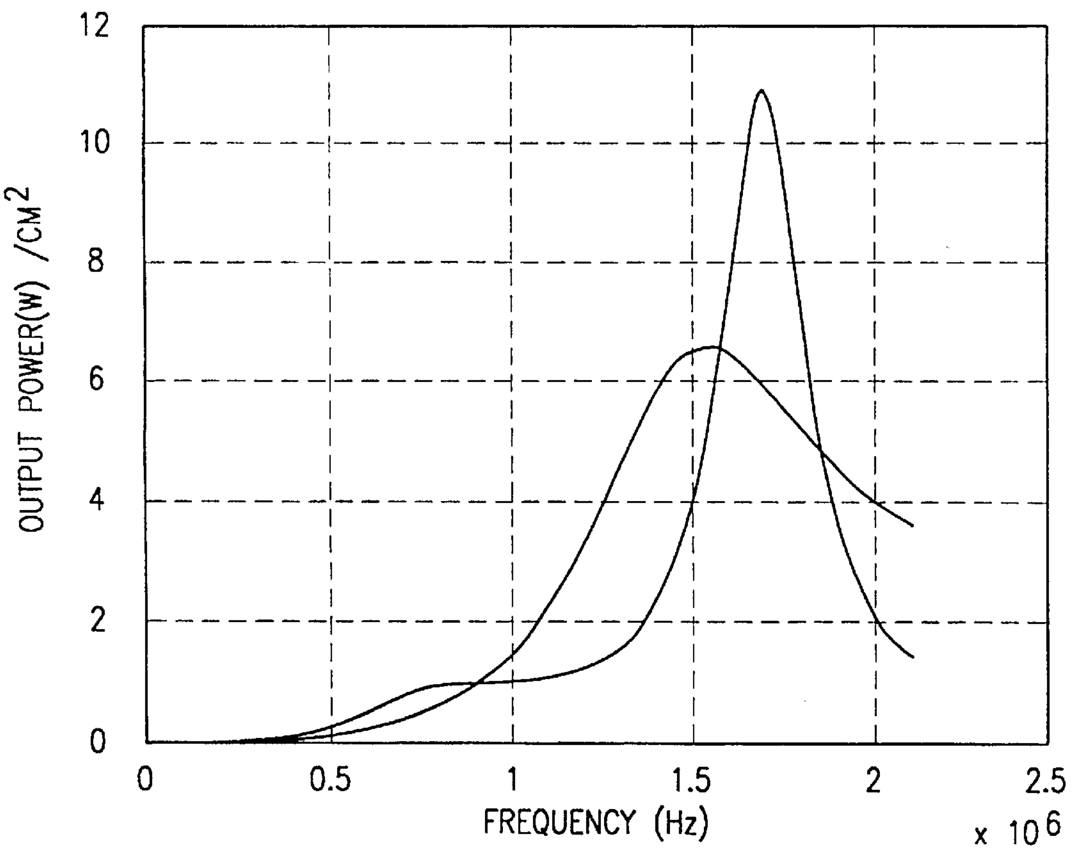
Figure 9A:
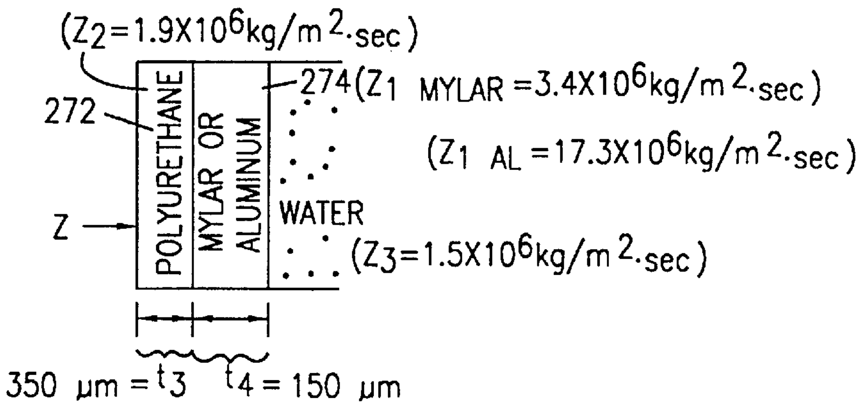
Figure 9B:
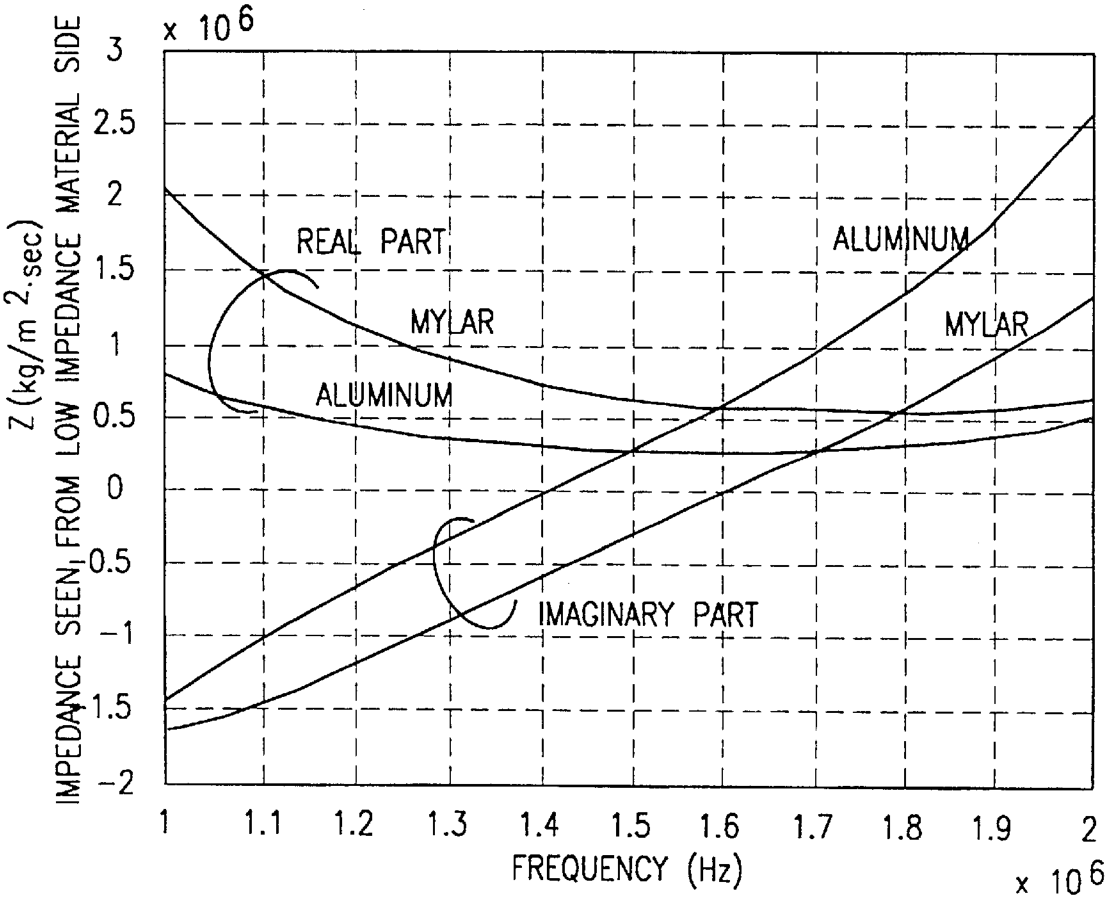
Figure 10A:
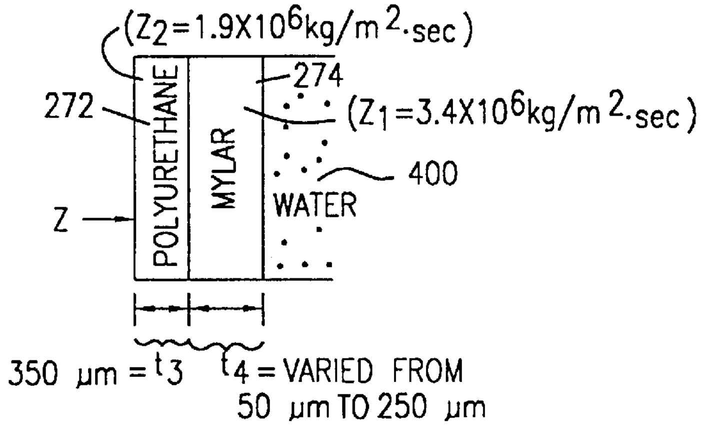
Figure 10B:
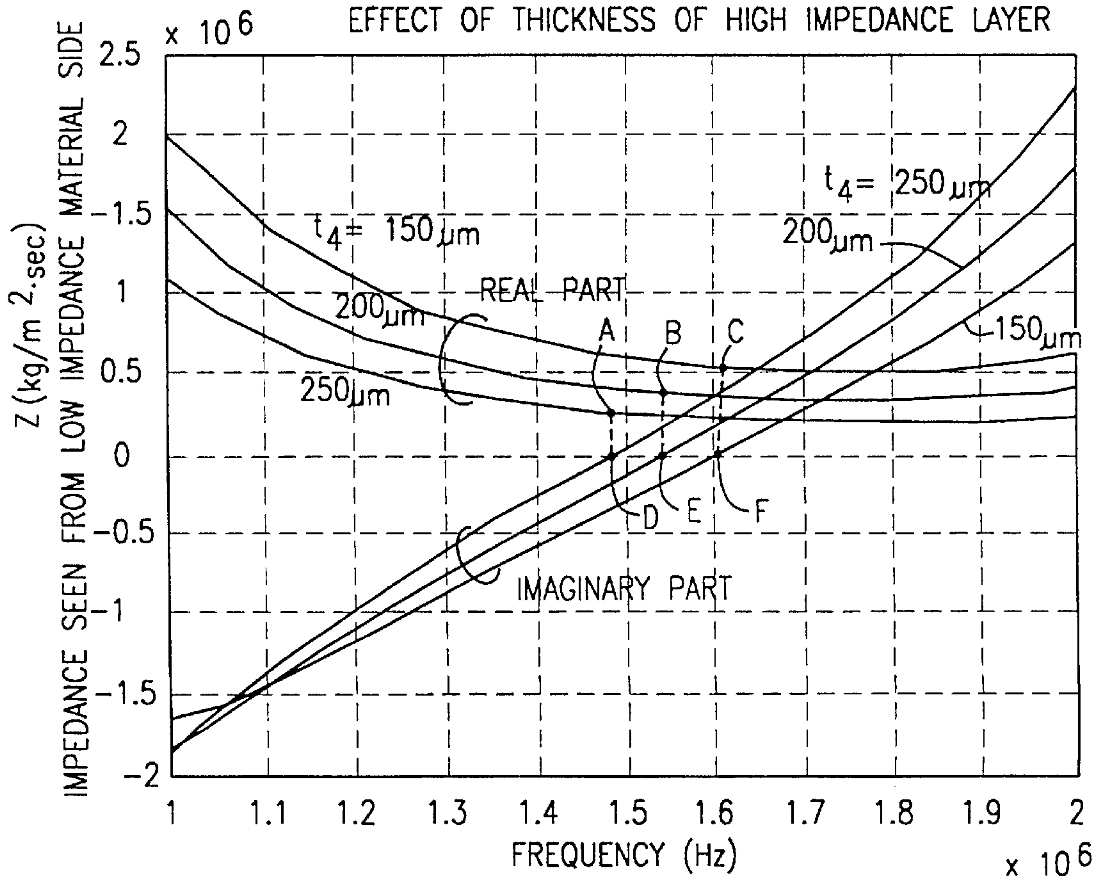
Figure 11A:
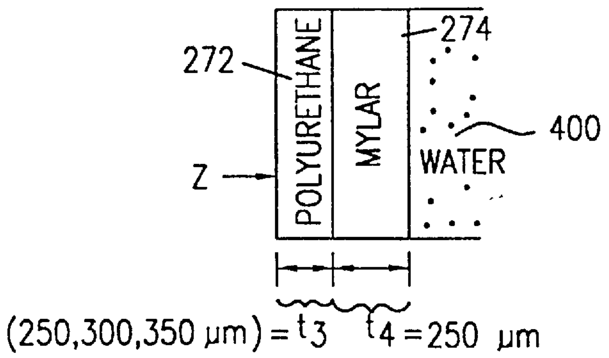
Figure 11B:
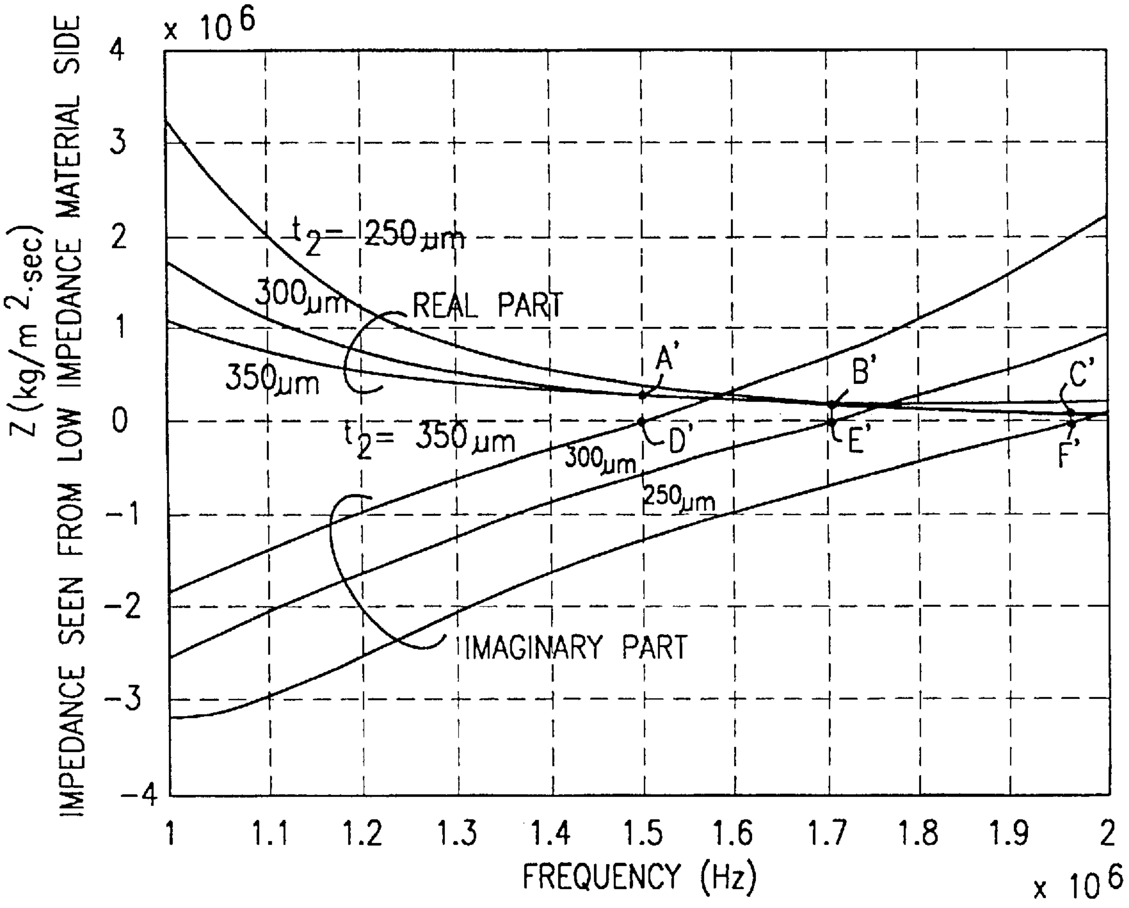
Figure 12A:
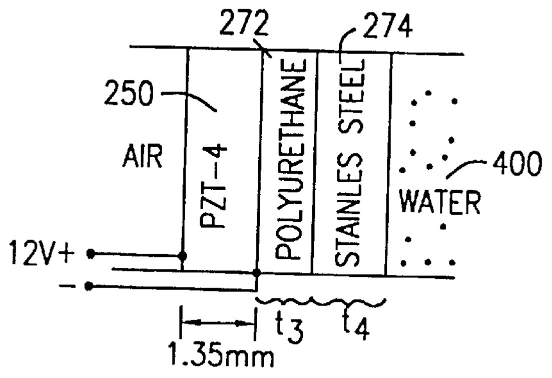
Figure 12B:
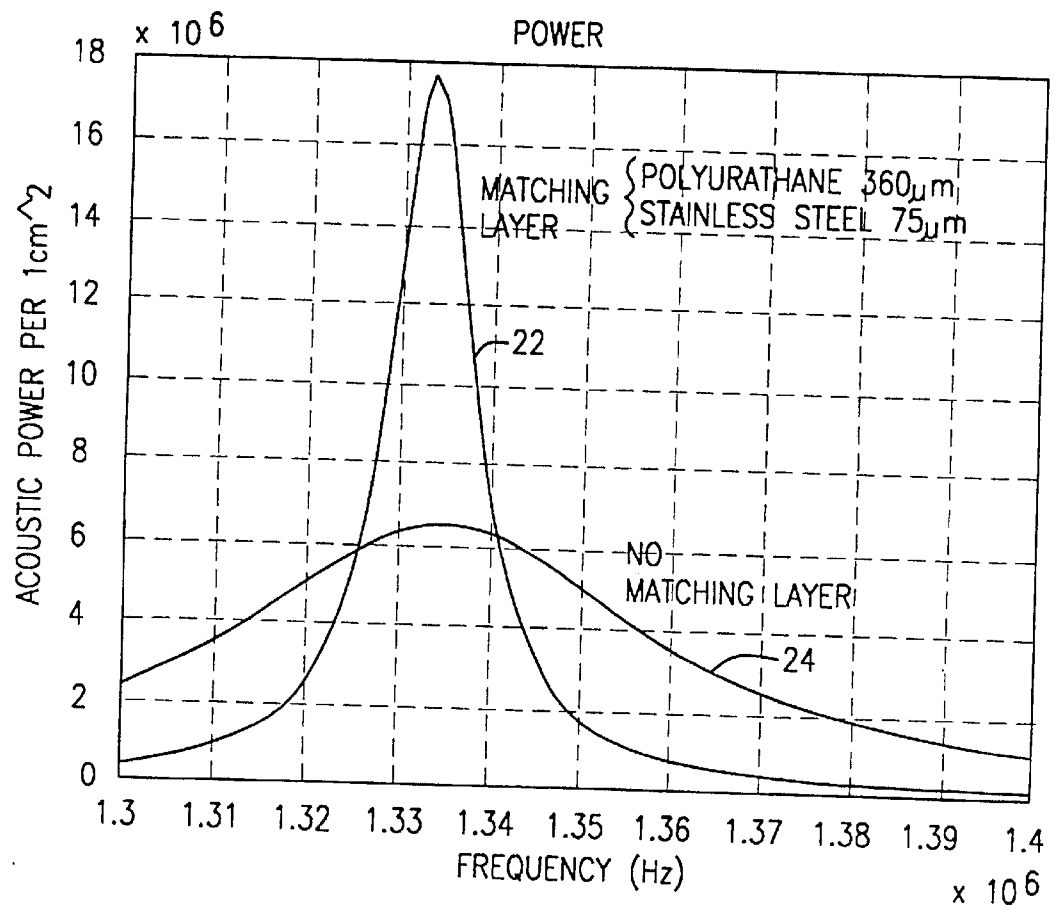
Figure 13A:
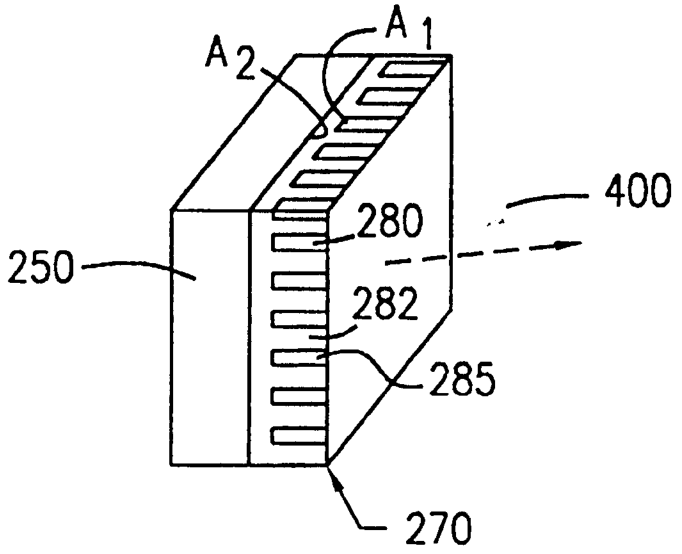
Figure 13B:
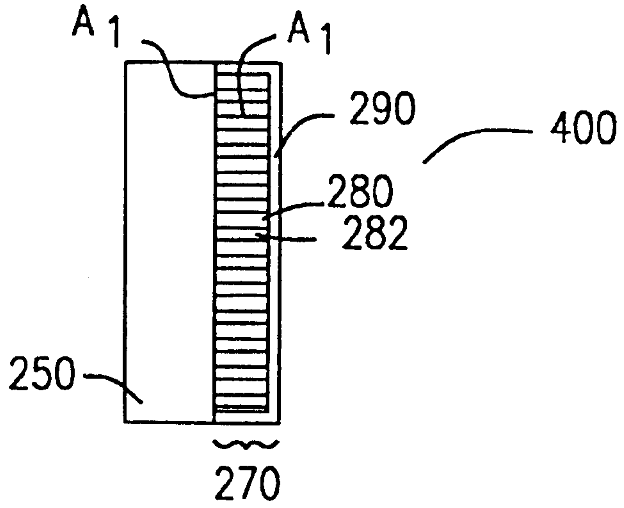

6B is a graphical representation of transducer output as a function of frequency for the transducer of FIG. 6A with and without a matching layer;

FIG. 7A is a schematic cross-sectional view of an ultrasonic transducer utilizing a double layer polymer for generating an acoustic wave into a transmission medium via a matching layer having impedance characteristics in accordance with an embodiment of the present invention;

FIG. 7B is a graphical representation of transducer output as a function of frequency for the transducer of FIG. 7A with and without a matching layer;

FIG. 8A is a schematic cross-sectional view of an ultrasonic transducer utilizing a dual matching layer structure in accordance with an embodiment of the present invention;

FIG. 8B is a graphical representation of transducer output as a function of frequency for the transducer of FIG. 8A with and without a matching layer;

FIG. 9A depicts an exemplary embodiment of the dual layer matching layer structure illustrating relative thicknesses and impedances of the matching layer according to the present invention;

FIG. 9B is a graphical representation of real and imaginary impedances as a function of frequency of the dual layer matching structure of FIG. 9A;

FIG. 10A depicts an exemplary embodiment of the dual layer matching layer structure similar to FIG. 9A;

FIG. 10B is a graphical representation of real and imaginary impedances as a function of frequency and variation in thickness of the dual layer matching structure of FIG. 10A;

FIG. 11A depicts an exemplary embodiment of the dual layer matching layer structure similar to FIG. 10A;

FIG. 11B is a graphical representation of real and imaginary impedances as a function of frequency and variation in thickness of the dual layer matching structure of FIG. 11A;

FIG. 12A depicts an exemplary embodiment of the dual layer matching layer structure similar to FIG. 11A;

FIG. 12B is a graphical representation of transducer output as a function of frequency for the transducer of FIG. 12A with and without a matching layer; and, FIGS. 13A and 13B depict respectively, perspective and side views of an ultrasonic transducer having a slotted matched array structure according to the present invention.

DETAILED DESCRIPTION

Piezoelectric, electrostrictive or relaxor type materials for thickness mode transducers can be crystals of $LiNbO_3$, quartz, $LiTaO_3$, TGS, ZnO, among others, or ceramic of PZT, PMN, PMN-PT material, or polymer films of PVDF or PVDF-TrFE. The propagation medium for the ultrasonic energy is a liquid such as water, water solution, organic liquid such as alcohol, oil, petroleum and the like. Also, solids are sometimes used as a propagation medium. While the present invention will work for any material mentioned above, examples of PZT and PVDF-TrFE copolymers will be presented and discussed herein.

Figure 1A:
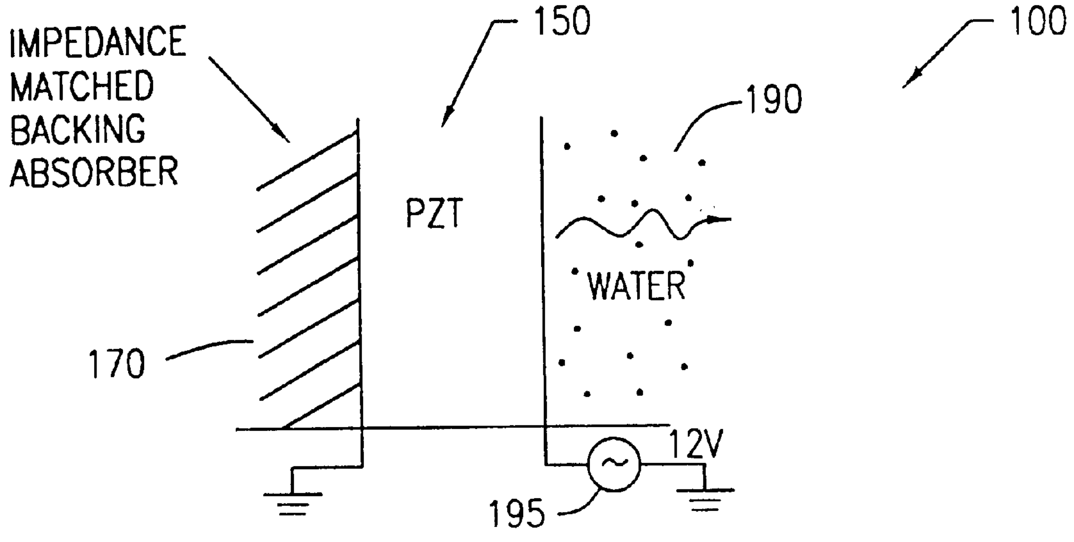
(PRIOR ART) FIG. 1A
FIG. 1A is a schematic cross-sectional view of a prior art non-resonant ultrasonic transducer having a layer of piezoelectric material for transmitting directly into a radiation medium.
Figure 1B:
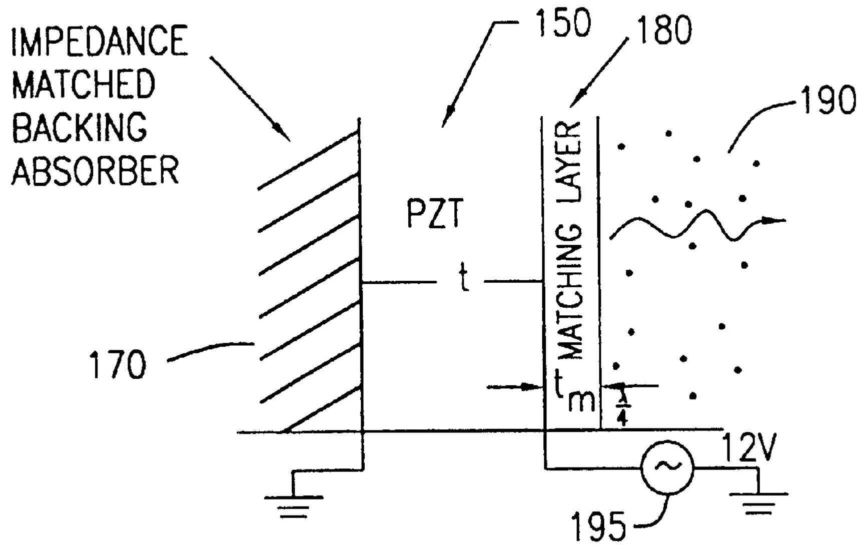
(PRIOR ART) FIG. 1B
FIG. 1B is a schematic cross-sectional view of a prior art non-resonant ultrasonic transducer structure utilizing a conventional matching layer structure.

FIG. 1A illustrates the basic structure of a non-resonant ultrasonic transducer for transmitting directly into a propagation medium without employing a matching layer. FIG. 1B illustrates an ultrasonic transducer having an impedance matched matching layer for acoustically coupling the transducer to the radiation medium.

For conventional impedance matching condition, the acoustic impedance of a matching layer is chosen to satisfy Eq. (1)and the matching layer thickness is chosen to be equal to one-quarter of the wavelength in the material. This well known, commonly accepted concept is that Eq(1) represents the best matching condition where there is no reflection from the transducer surface and therefore generally it is believed that output wave amplitude becomes larger than the mismatched case of no matching layer.

Figure 1C:
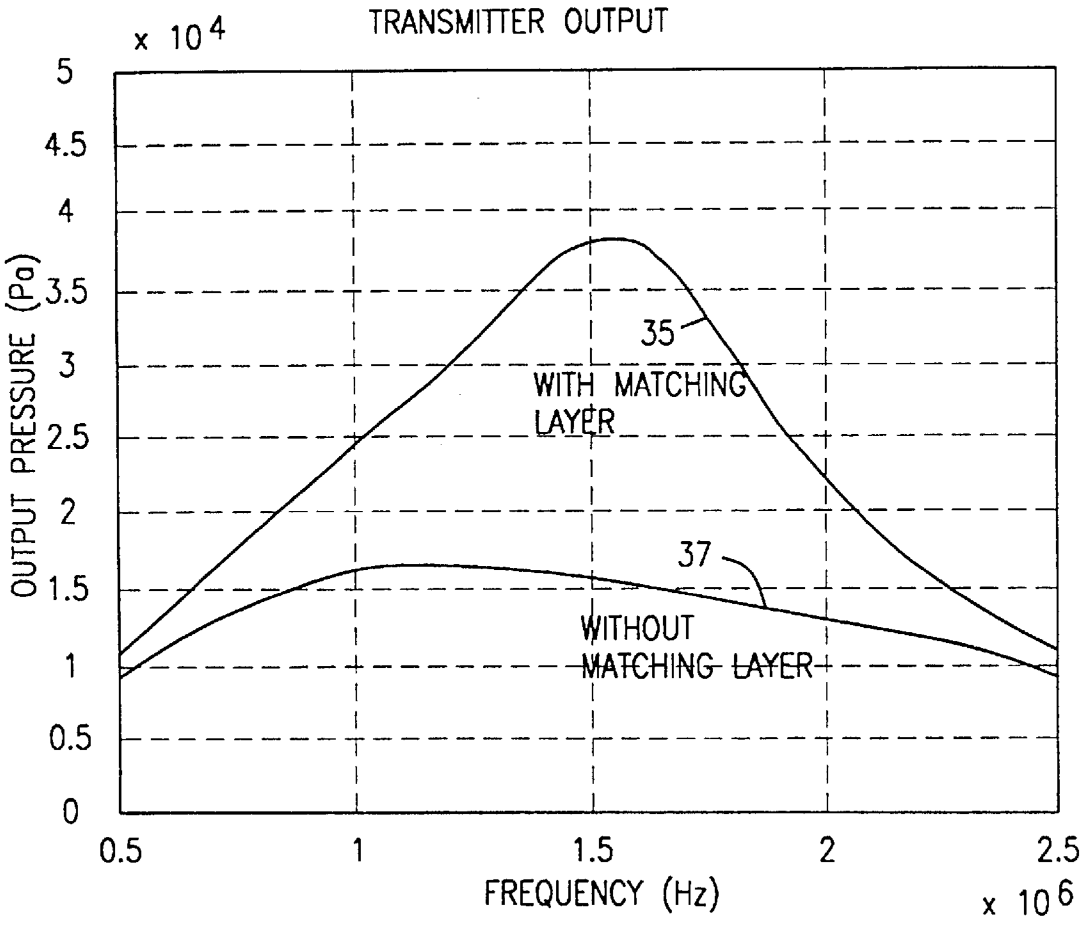
FIG. 1C is a graphical representation of transducer output as a function of frequency for the ultrasonic transducer structures of FIGS. 1A and 1B.

Referring to FIGS. 1A and 1B, transducer structure 100 comprises a vibrating layer 150 of PZT-5A with thickness t of $\lambda/2=1.4$ mm, and ideal backing absorber 170, the impedance of which is chosen to be equal to that of the PZT. A front matching layer 180 (FIG. 1B) satisfying Eq(1) is disposed between the PZT material and aqueous radiation medium 190. A 12 volt source potential 195 is applied across piezo layer 150. The waves excited in the PZT propagate towards the front and back directions. It is assumed the impedance of back absorber 170 ($Z_b=p_bV_b$) is perfectly matched to that of PZT ($Z_p=p_pV_p$). Therefore, backward waves are not reflected at the backside boundary of the PZT layer and all the backward wave energy is absorbed in the absorber 170. This non-reflection from backside boundaries can make a transducer non-resonant. The wave migrating towards the front direction (i.e. direction of radiation medium 190) is reflected at the front boundary while a portion is transmitted into. the radiation medium. When the front matching layer 180 is added (as in FIG. 1B), there is no reflection at the front boundary. This causes an increase in the output (sensitivity). FIG. 1C depicts simulation curves 35, 37 for the two cases depicted in FIGS. 1A and 1B, with and without matching layers, respectively, using Mason model simulation for a transmitter. An ultrasonic receiver also has similar performance. The output or sensitivity is higher for the case where a matching layer (using a condition of Eq(1) inserted). The matching layer works best at the $t_m=\lambda/4$ condition. Accordingly, at that matching frequency, the bandwidth is narrower. This is a well-known result for a non-resonant transducer.

Figure 2A:
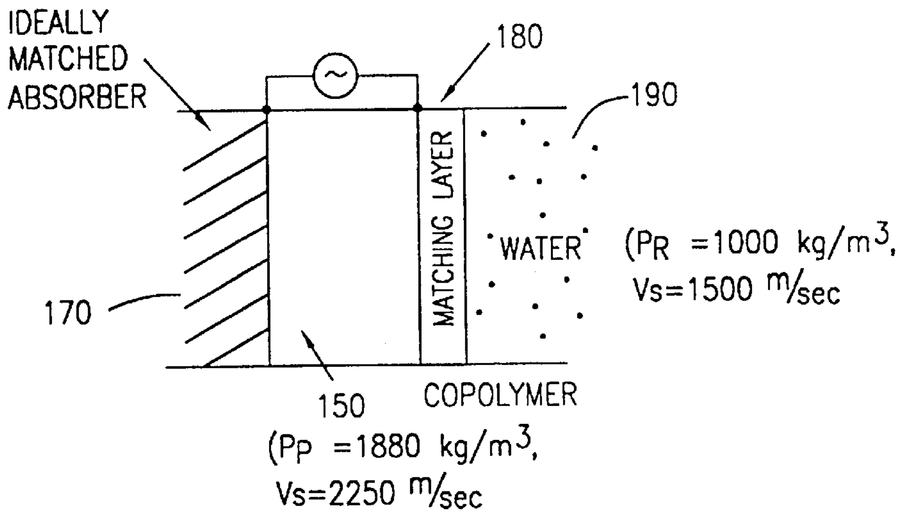
FIG. 2A is a schematic cross-sectional view of a non-resonant polymer transducer structure having a conventional matching layer.
Figure 2B:
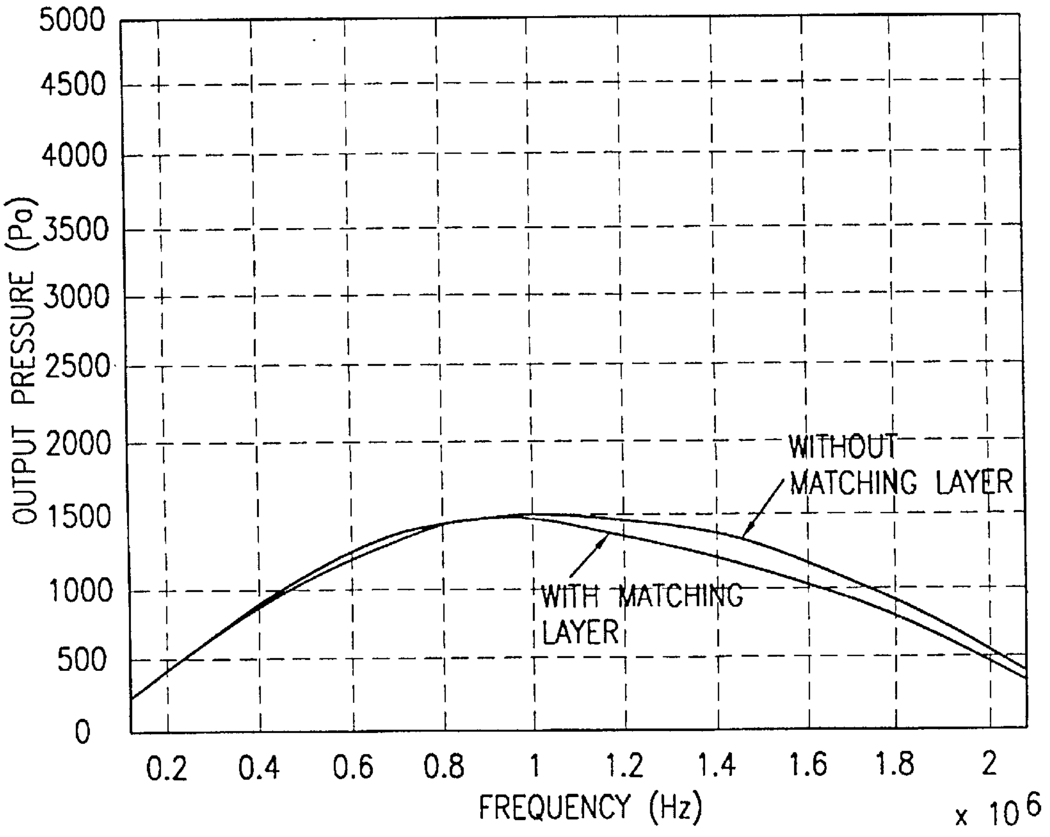
FIG. 2B is a graphical representation of transducer output as a function of frequency for the transducer of FIG. 2A with and without a matching layer.

In the case of a PVDF-TrFE copolymer layer 150, shown in FIG. 2A, simulation results depicted in FIG. 2B illustrate that $\lambda/4$ matching layer has almost no effect on output (sensitivity) and also on bandwidth. This is because the impedance of the copolymer is not much different from that of water.

Figure 3A:
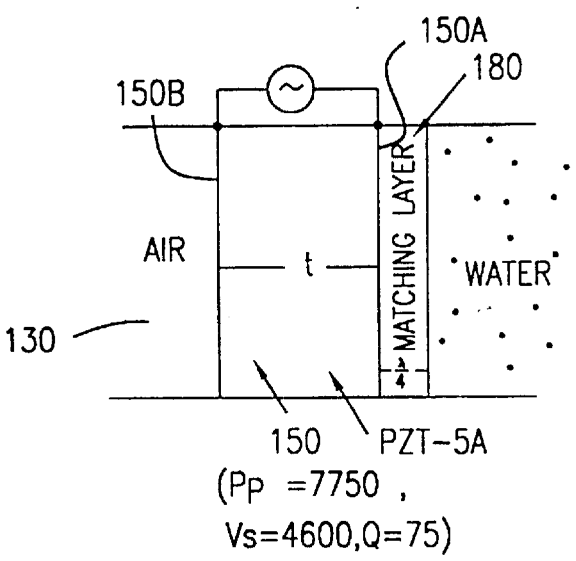
FIG. 3A is a schematic cross-sectional view of a resonant PZT transducer structure having a conventional matching layer.
Figure 3B:
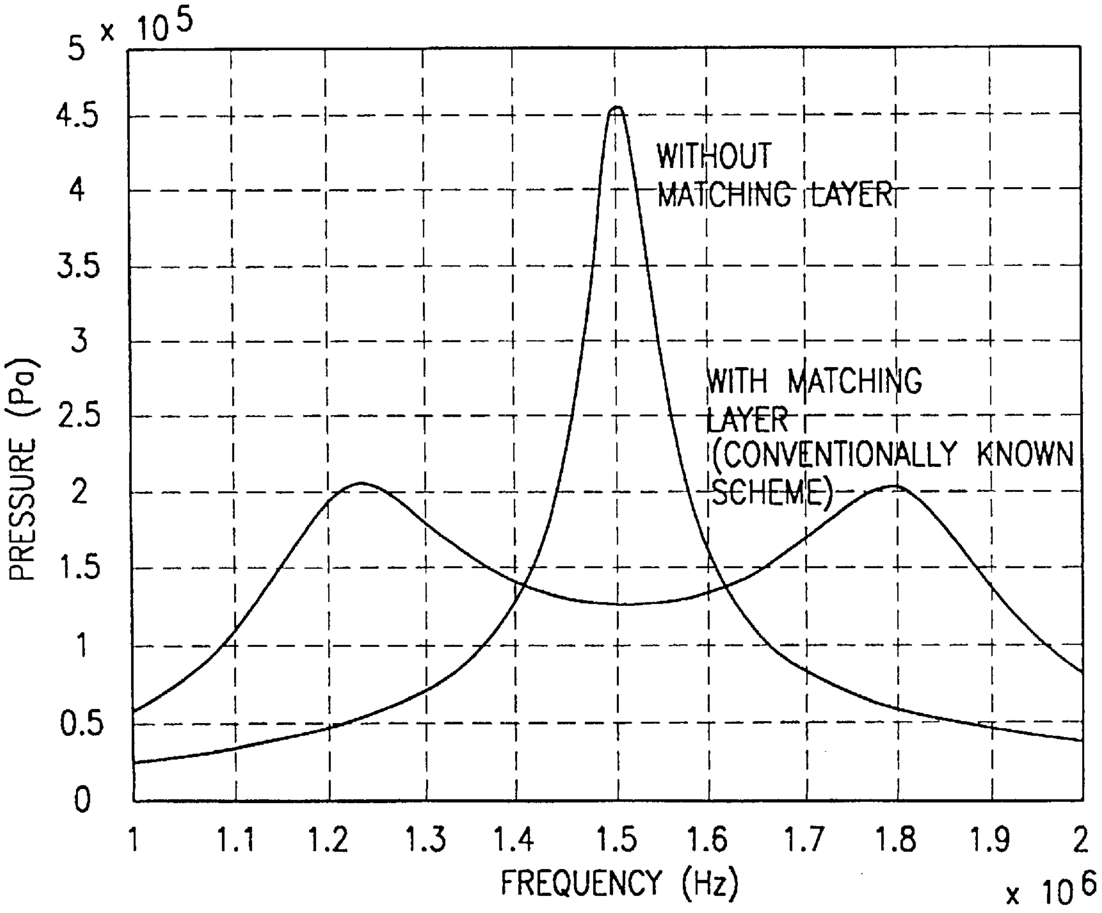
FIG. 3B is a graphical representation of transducer output as a function of frequency for the transducer of FIG. 3A with and without a matching layer.

FIGS. 3A and B illustrate the structure associated with a resonant transducer using the conventional matching layer impedance, and a plot of transmitter output as a function of frequency for a resonant transducer with and without the conventional matching layer respectively. Referring to FIGS. 3A and 3B, when the back absorber is removed from transducer 150 and air-backing layer 130 is used, a generated wave is reflected at the front 150A and back surfaces 150B and travels back and forth. At the condition when phases of multiple reflection waves agree, the wave amplitude becomes stronger, defining a resonance frequency $f_r$. The resonance condition is satisfied when the thickness t of piezoelectric layer 150 equals half of the wavelength.

Figure 4A:
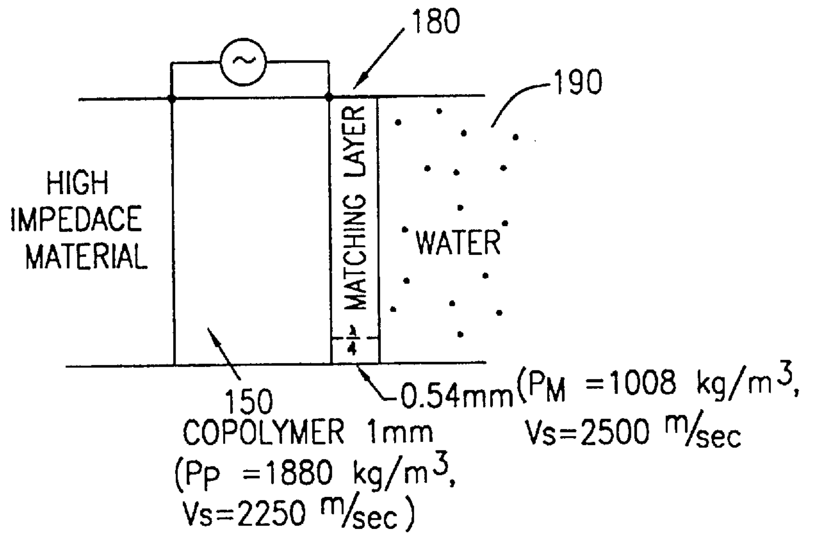
FIG. 4A is a schematic cross-sectional view of a resonant polymer transducer structure having a conventional matching layer.

As shown in FIG. 4A, there is provided another resonance condition of PVDF-TrFE copolymer (or PVDF) layer 150. In this case, a very heavy and stiff (high impedance) material, such as metal, ceramic, porcelain, or glass is used as backing 130. The function of the backing is to reflect the backward wave to forward. The thickness of the copolymer layer is one-quarter wavelength. For PZT, which has very high impedance, (and other higher impedance material) such layer is not available so that quarter wavelength resonance is not possible.

Figure 4B:
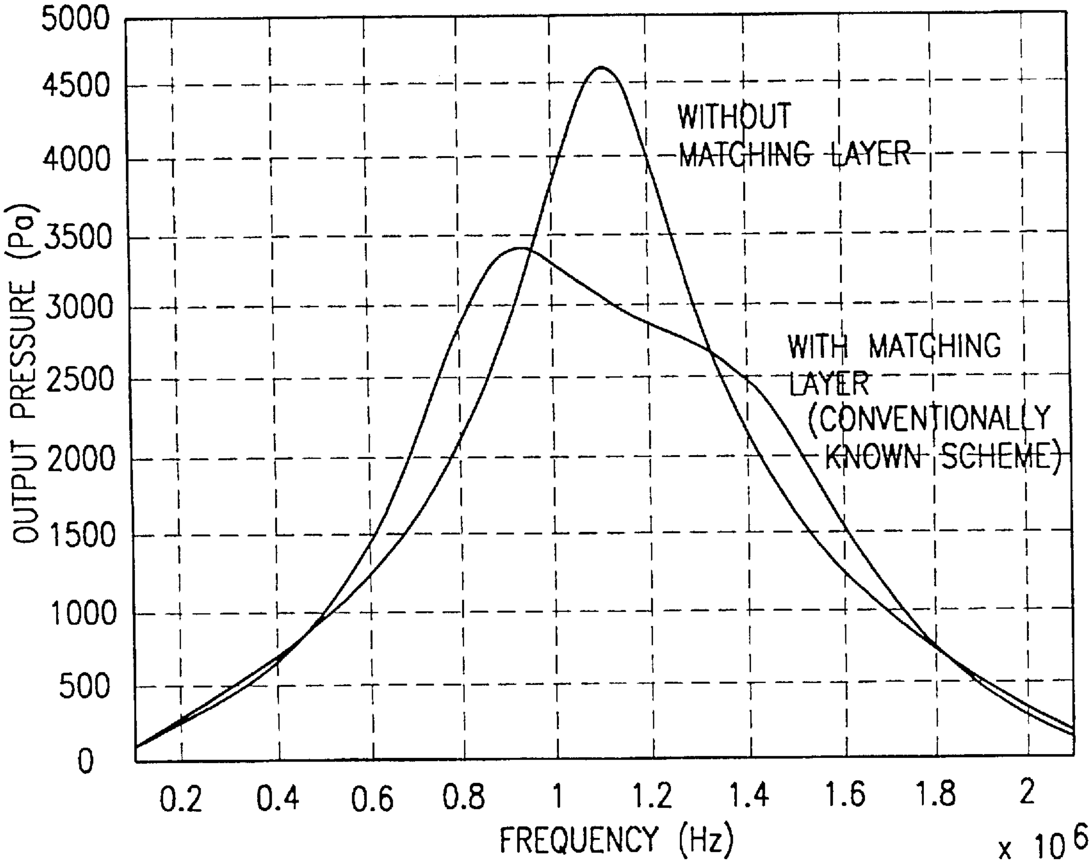
FIG. 4B is a graphical representation of transducer output as a function of frequency for the transducer of FIG. 4A with and without a matching layer.

When front matching layer 180 satisfying Eq.(1) is added, the bandwidth becomes broader but the amplitude is reduced. This is depicted in FIG. 3B for PZT and FIG. 4B for the copolymer of PVDF-TrFE. While the wideband performance is very well known, the reduction of amplitude as shown in these figures is not.

In the case of a resonant transducer, the impedance seen from the front surface 150A in FIG. 3A is much less than the impedance of the transducer material, $p_pV_p$. Generally, impedance is defined by ratio of applied vibrational force to responding velocity. At resonance frequency, vibrational velocity is largest, and therefore impedance is smallest. After calculations, it has been found that impedance at resonance is given by:

$Z_{p,R}=(\pi/2)(P_pV_p)/Q_p$ for air backing, $\lambda/2$ thick piezoelectric layer and $Z_{p,R}=(\pi/4)(p_pV_p)/Q_p$ for infinitely high impedance backing $\lambda/4$ thick piezoelectric layer (Eq. 2)

$Q_p$ is the mechanical quality factor (inverse of elastic loss factor) of piezoelectric material and is 75 for PZT-5A and 15 for PVDF-TrFE copolymer. Note here $Z_{p,R}$ does not include resonance frequency which is determined by thickness.

Because the impedance of the transducer at resonance is $Z_{p,R}$ but not $Z_p$, the best matching condition is given by Eq(1) using $Z_{p,R}$ replaced for $Z_p$. $Z_{p,R}$ and $Z_p$ of PZT-5A and PVDF-TrFE and also water are represented as follows:

| | PZT-5A | PZT-4 | PVDF-TrFE | Water |
|---|---|---|---|---|
| | $Q_p = 75$ | $Q_p = 500$ | $Q_p = 15$ | — |
| $Z_{p,R}(\frac{\pi}{2})$ | $7.14 \times 10^5$ | $9.6 \times 10^4$ | $4.4 \times 10^5$ | — |
| $Z_{p,R}(\frac{\pi}{4})$ | — | — | $2.2 \times 10^5$ | — |
| $Z_p$ | $3.57 \times 10^7$ | $3.0 \times 10^7$ | $4.23 \times 10^6$ | — |
| $Z_R$ | — | — | — | $1.5 \times 10^6$ |

Unit: $Kg/m^2$ sec

The highest output (or sensitivity) condition of matching layer is given by $$Z_m=(Z_RZ_{p,R})^{1/2} \quad \text{(Eq. 3)}$$

In a case where the radiation medium is water, $Z_m$ for $\lambda/2$ transducer is given by

| | PZT-5A | PVDF-TrFE | |
|---|---|---|---|
| $Z_m$ | $1.03 \times 10^6$ | $7.97 \times 10^5$ | $Kg/m^2sec$ |

These values are very much lower than the values of $Z_m$ obtained via the conventional concept. In accordance with the present invention, FIGS. 5B and 6B show results of simulations for respective transducer structures of PZT-5A and PVDF-TrFE shown in FIGS. 5A, 6A, where the above $Z_m$ acoustic impedance value for the matching layer is used. Above values of $Z_m$ are not available for conventional material, but rubber or polymers with very tiny bubbles inclusion is suitable. Note that, throughout the remainder of the drawings, like reference numerals are used to indicate like parts.

Figure 5A:
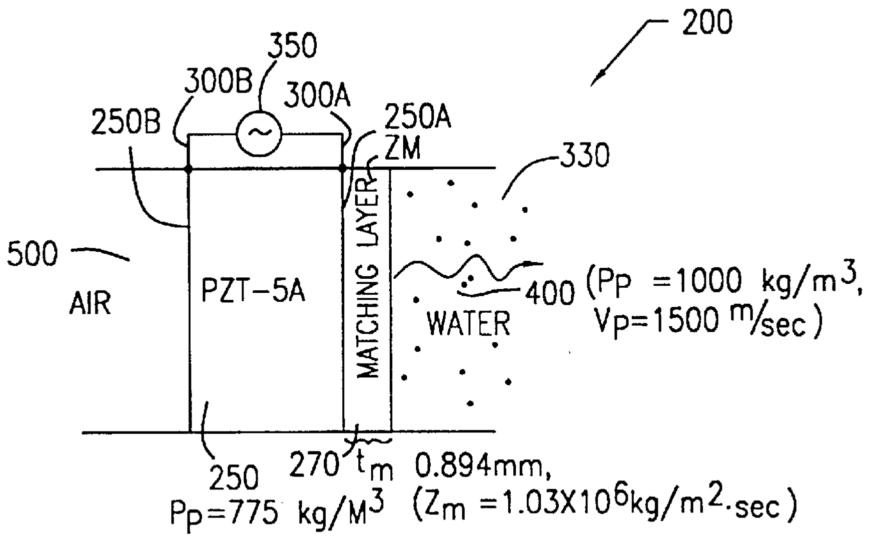
FIG. 5A is a schematic cross-sectional view of an ultrasonic transducer utilizing a layer of PZT for generating an acoustic wave into a transmission medium via a matching layer having impedance characteristics in accordance with an embodiment of the present invention.
Figure 5B:
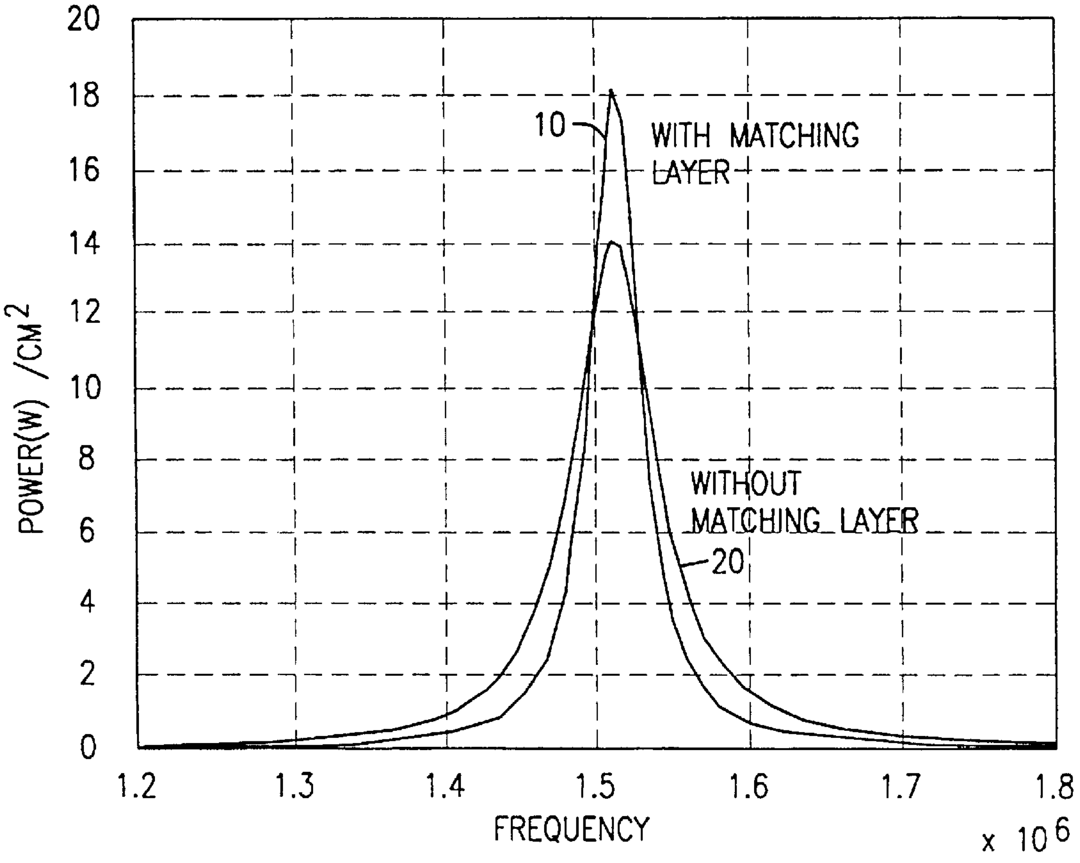
FIG. 5B is a graphical representation of transducer output as a function of frequency for the transducer of FIG. 5A with and without a matching layer.
Figure 6B:
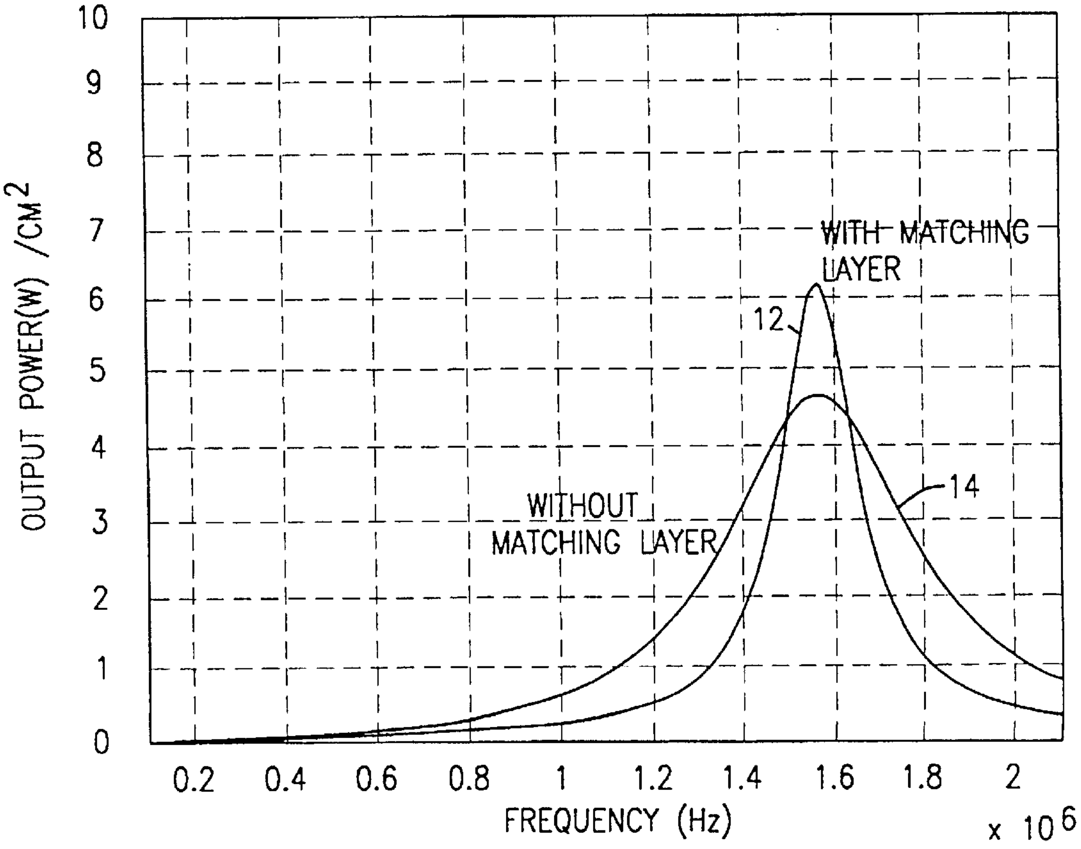

Referring now to FIG. 5A, a resonant transducer structure 200 comprises a vibrator body 250 of piezoelectric material PZT-5A which is coupled at respective front 250A and back 250B conductive surfaces via electrode wires 300A, 300B connected to generate a voltage difference across the piezoelectric body to excite the body and generate the acoustic wave 330 at a resonant frequency $f_r$ for transmission to radiation medium 400 (e.g. water). (Herein thin electrodes are furnished on surfaces 250A and 250B). As shown in FIG.

5A, an air backing 500 is used adjacent back surface 250B. Matching layer 270 is disposed adjacent front surface 250A and bonded thereto at a first surface of the matching layer and to radiation medium 400 at a second surface opposite the first surface. PZT-5A layer 250 has an acoustic impedance $Z_{p,R}$ associated with a resonant frequency (of, for example 1 MLHZ) which is lower than the acoustic impedance $Z_R$ associated with the radiation medium 400. Note that, as is shown in FIG. 5A, the radiation medium includes the physical parameters $P_p$=1,000 Kg/m$^3$, and $V_p$=1500 m/sec. The matching layer 270 acoustically matches PZT ceramic layer 250 with radiation medium 400 and has an acoustic impedance value $Z_m$ which lies between the "low" impedance PZT material at resonance and the "high" impedance radiation medium. Preferably the matching layer shown in FIG. 5A has a width $t_m$ of approximately of 0.894 mm and an acoustic impedance $Z_m$ of 1.03×10$^6$ kg/m$^2$ sec. Transmitted output power is a function of the resonance frequency associated with the structure and is depicted in FIG. 5B for the structure of FIG. 5A. As shown in FIG. 5B, curve 10 is associated with the resonant transducer utilizing the matching layer acoustic impedance criteria of less than the radiation medium. Curve 20 represents the transmitter power output as the function of frequency without employing a matching layer. As can be seen, power output is significantly increased while the narrowband frequency range is reduced. Power source 350 operates to generate a voltage of approximately 20 volts nns to cause the transducer to be operative in a continuous wave mode.

FIG. 6A shows a variation of the resonant transducer and novel matching layer structure which employs a copolymer material vibrating body 250. Referring to FIG. 6A the thickness t1 associated with the copolymer layer 250 is approximately 0.7 mm while thickness t2 associated with a matching layer 270 is 0.398 mm. The copolymer layer is excited by a potential of 800 volts rms across its front and back surfaces for transmitting the cw acoustic waves into water medium 400. The acoustic impedance associated with the matching layer 270 is 7.97×10$^5$ Kg/m$^2$ sec., which is less than that of water (z=1.5×10$^6$) and greater than that associated with the piezo impedance at resonance.

FIG. 6B illustrates the increase in output power and reduction in bandwidth associated with the resonant transducer polymer with the matching layer (curve 12) depicted in FIG. 6A versus a resonant transducer without a corresponding matching layer (curve 14).

FIG. 7A shows an embodiment of a resonated transducer having a double polymer layer vibrating body structure 250 comprising resonating layers 252 and 254. Vibrating layer 252 comprises a copolymer PVDF-TrFE of a first thickness t1 which is bonded to a second layer 254 of mylar material having a thickness t2 of approximately 0.25 mm. Copolymer layer 252 is bonded at a second surface opposite the first surface to a backing layer 510 of alumina having a very high impedance of 4.2×10$^7$ Kg/m sec. The alumina backing layer preferably has a thickness $t_3$ of approximately 0.7 mm.

As shown in FIG. 7A, copolymer layer 252 is excited by a potential source of 700V rms applied at electrodes disposed on the first and second opposing surfaces to cause generation of the acoustic wave 330 into water medium 400. In this case, the copolymer layer 252 is thinner than one quarter wavelength (0.153λ) and the mylar layer 254 (0.1488λ) is added to make the total polymer thickness roughly equal to one quarter of the wavelength.

As shown in FIG. 7A, the material properties associated with each of backing layer 510, double layer polymer structures 252 and 254, and matching layer 270 are as follows: alumina layer 510 comprises $p_a$=3800 Kg/m$^3$, $V_a$=111080 m/s, and $Q_a$=500. Copolymer layer 252 has material parameters of $p_a$=1880 Kg/m$^3$, $V_p$=2250 m/sec, and $Q_p$=15. Mylar layer parameters are p=1350 Kg/m3, V=2520 m/sec, and Q=30. Finally, the matching layer 270 has a thickness t4 of 0.215 mm, and an acoustic impedance $Z_m$=4.6×10$^5$ Kg/m$^2$ sec, and Q=20. The best impedance of the front matching layer 270 is somewhat different from Eq. (2) and (3) because of the more complicated structure. Using Mason model simulation, the best condition of matching layer is determined so as to obtain highest output power. In the case of FIG. 7A, the best thickness of the matching layer is less than quarter wavelength (approximately 0.15 of wavelength).

FIG. 7B provides a graphical illustration of the output power as a function of resonant frequency associated with the resonant transducer structure of FIG. 7A. As can be seen, by curve 15, the power output at the resonant frequency using the matching layer structure shown in FIG. 7A is substantially greater than curve 17 which illustrates a resonant transducer which does not employ the novel matching layer.

As shown in FIG. 7A, matching layer 270 has an acoustic impedance value less than the acoustic impedance associated with the water medium 400 but greater than that associated with the double layer polymer resonant structure, for providing the high output power at narrowband frequency as depicted in FIG. 7B. The matching layer 270 should therefore be constructed of low impedance a material lower than that of water medium 400. Typically, the acoustic impedance of polyurethane material is 1.9×10$^6$ Kg/m$^2$s This does not vary for different types of polyurethane with Shore hardness ranging from 20 A to 85 A. Silicone rubber material has an acoustic impedance of 1.3×10$^6$ Kg/m$^2$s and natural rubber is 1.7×10$^6$ Kg/m$^2$s. These values are too high for the present application. Rather, a matching layer having an acoustic impedance which is substantially less than that of water (1.5×10$^6$ Kg/m$^2$s) is needed. This requirement is difficult or practically may not be possible to obtain in naturally occurring materials. Therefore one may have to make, artificially low impedance material structures.

One such type of material for use as a matching layer having an impedance lower than water comprises bubble included materials. These low density and low velocity materials can be synthesized in various ways. An example is bubble inclusion in soft rubber type materials. The size of the bubble should be small because the acoustic wave is scattered by large bubbles, resulting in greater acoustic loss. The bubble size should be approximately two orders of magnitude smaller than the wavelength. If the size is one order smaller than the wavelength, the loss will be significant. In the case of a 1 MHZ resonant frequency, a bubble size of ~0.01 mm or less is sufficient. Also, uniform dispersion of bubbles is necessary in order to avoid additional loss. Such materials can be synthesized by combination of chemical reaction, heating, cooling and gas introduction. Such examples include: (1) sintering of therino plastic fine powder at a temperature for critical melt (2) gas emission from fine particles in a high temperature and cooling (3) chemical reaction of fine powder material with liquid for gas emission (4) high speed whipping of high viscosity material (like ice cream) (5) fine bubble formation from nozzle into a high viscosity liquid and cooling, etc are possible.

Because it is desired to have an acoustic impedance lower than that of water (or liquid, or human tissue), the host material should have low impedance such as polyurethane or rubbery materials. In another alternative embodiment depicted in FIGS. 13A–B, the matching layer 270 may comprise a narrow strip 280 of rubbery material for acoustically matching piezoelectric layer 250 with radiation medium 400.

When the effective cross section of the matching layer is small, the acoustic impedance becomes smaller, and therefore an array of narrow long strips 280 vertical to the transducer surface and having an air space or gap 282 between each of the strips is provided. This allows for the averaged acoustic impedance of the matching layer to be lower than that of water. The material should be a polyurethane or rubber material.

The front surface and side of the matching layer is covered by an encapsulating layer 290 which keeps air inside. The space or gap 282 and also the width of the strip 280 should be as small as possible because a thin encapsulating layer tends to have flexural vibration, which decreases the output power. The criterion for whether or not flexural wave motion influences the transducer is whether is that quarter wavelength of the flexural wave is larger than the space between strips. Since the wavelength of flexural wave is larger for a thicker plate, it is possible to make the encapsulating layer thick. However, in this case, the effect of the thickness has to be explicitly taken into account during the design process.

A similar structure is disclosed in U.S. Pat. No. 5,434,827. However, this patent uses the conventional impedance matching principle such that a high impedance material is used for the slotted array and the acoustic impedance of the matching section defined by the fractional cross sectional area (averaged) is chosen to fall in between that of water (low impedance) and the transducer material (very high impedance). Therefore, the transducer material itself has many slots to serve as the matching layer.

In accordance with the present invention, any transducer at a strong resonance condition has very low impedance, less than that of water, so that a rubbery material with small fractional area of cross section is used for the matching section.

The effective acoustic impedance of such an array type is reduced in proportion to the fraction of the effective area $A_1$ of cross section of all strips 280 to the whole transducer area $A_2$ covered by the matching structure. More specifically, effective acoustic impedance of polyurethane strips is given by (A1/A2) $1.9\times10^6$ Kg/m$^2$sec, and A1/A2=0.54 to get Zm=$0.03\times10^5$ Kg/m$^2$sec for PZT-5A and A1/A2=0.42 to get Zm=$7.97\times10_5$ Kg/m$^2$sec for PVDF-TrFE.

In yet another embodiment of the present invention depicted in FIG. 8A, a dual layer matching layer structure is provided for reducing the impedance as seen from the front surface of the transducer body to a value less than that of the radiation medium.

When a high impedance plate thinner than one quarter wavelength and a low impedance layer with roughly one quarter wavelength thickness are combined and are in water, the impedance seen from the low impedance side becomes very low, much less than that of water. This is because the reflection from the high impedance plate has phase shift after traveling a distance of $\lambda/4$ such that the low impedance section and the high impedance section are converted to a low impedance. The principle of this propagation effect is found in microwave transmission line theory, but has not been applied to ultrasonic layer structure. This double layer matching structure has the same effect as single low impedance layer.

Referring to FIG. 8A, the resonated transducer depicted therein comprises the double layer polymer resonator section 250 consisting of a PVDF-TrFE layer 252 of thickness $t_1$ of 0.23 mm bonded at a first surface to mylar layer 254 of thickness $t_2$ of 0.25 mm. The matching layer comprises a polyurethane layer of thickness $t_3$=0.175 mm (P=1240 Kg/m$^3$, V=1520 m/sec) adjacent the mylar layer 254 and a second mylar layer 274 having a thickness t4 of 0.25 mm. Layers 272 and 274 operate to define the matching layer with polyurethane layer 272 sandwiched between mylar layers 254 (part of the resonating body) and 274 (outer portion of matching layer). Layer 274 is defined as the outer layer while layer 272 is defined as the inner layer of matching layer 270. Outer layer 274 of mylar is also adjacent and in contact with the radiation medium 400. A high impedance backing layer 510 of alumina is bonded to a second surface of PVDF-TrFE layer 252.

The acoustic impedance of the inner side layer 272 does not have to be lower than that of water medium 400, but it should be relatively lower than that of the outer side material 274. The inner low impedance material layer 272 can also be natural rubber (which is somewhat higher than water) which is sufficient to provide a combined effective input impedance having a value much lower than water. Other possibilities of inner material include silicone rubber polybutadiene, polyisoprene or polychloroprene.

Referring to FIG. 8A in conjunction with FIG. 9A, the impedance Z. as seen from the Point A to output side is actually loaded to the transducer material 252, 254 impedance at resonance ($0.1$–$0.7\times10^6$ Kg/m$^2$s). Therefore, this Z value should be matched to these resonance values.

FIG. 9A depicts a polyurethane layer having an impedance Z2=$1.9\times10^6$ Kg/m$^2$sec of thickness $t_3$=350 $\mu$m, and a mylar layer 274 having impedance Z1=$3.4\times10^6$ Kg/m$^2$sec. Alternatively, the layer may be of aluminum (Z1=$17.3\times10^6$ Kg/m$^2$sec) of thickness $t_4$=150 $\mu$m. Similarly FIGS. 10A, 11A and 12A each depict differing layer thicknesses and materials which comprise the dual structure matching layer having an effective impedance less than that of the radiation medium 400.

The Z values are plotted as a function of frequency and shown in FIGS. 9B, 10B and 11B, each respectively corresponding to the structures depicted in FIGS. 9A, 10A and 11A. FIG. 9B shows the effect of material of a high impedance, thin ($t_4$=150 $\mu$m) outer layer 274. As shown in FIG. 9B, the imaginary part varies from negative to positive and crosses zero at a particular frequency. Therefore, Z becomes a purely real number at that given frequency. The zero-crossing frequency should be chosen to be equal to the resonance frequency of the transducer. A higher impedance of the outer layer is thus converted to a lower impedance value. In this manner, alumina has higher impedance than Mylar but the effective impedance Z becomes lower.

In FIG. 10A, in order to choose the zero-crossing frequency, the thickness of outer plate 274 is varied. This, in turn, influences the effective Z values. FIG. 10B provides a graphical representation of the impedance z seen from the low impedance material side as a function of frequency, and it illustrates the effect of thickness of the high impedance layer. As can be seen from an analysis of FIG. 10B, the thicker the outer plate 274, the lower the effective impedance Z at the zero crossing frequency (Points A, B. C) is obtained. Also, the thicker the outer plate, the lower zero crossing frequency is seen (Points D, E, When the thickness of the inner layer 272 is increased, as depicted in FIGS. 11A, 11B, the zero crossing frequency becomes lower. However, the effective impedance Z does not vary much as shown in FIG. 11B (Points A', B', C").

Since the impedance matched condition is rigorously satisfied only at the zero-crossing frequency, the non-zero imaginary part at other frequencies provides a mismatched transducer structure having a reduced output lower. This makes the output response curve or bandwidth sharper. FIG. 12B shows the output power curves with (curve 22) and without (curve 24) a double matching layer for the PZT-4 transducer illustrated in FIG. 12A. The effect of the matching layer is remarkable for power output. As shown in FIG. 12A, the transducer structure shown therein comprises a matching layer consisting of a stainless steel outer layer 274, and an inner polyurethane layer 272 which is coupled at first surface to acoustically match resonating layer 250 comprising PZT-4 material. A source potential of 12 volts is connected via electrodes to the front and back surfaces of PZT-4 layer 250 for providing excitation of the transducer. As shown in FIG. 12A, the PZT-4 layer is approximately 1.35 mm thick. Polyurethane inner layer 274 has a thickness of 360 $\mu$m while stainless steel layer 274 has a thickness of 75 $\mu$m. An air backing is used in the structure depicted in FIG. 12A and is in contact engagement with the back surface of PZT-4 layer 250.

Note that the layer 250 of PZT-4 material illustrated in FIG. 12A has significantly different characteristics than that of the copolymer layer vibrating body 250 depicted, for example, in FIGS. 7A and 8A. For instance, PZT material represents a very heavy material in comparison to the soft, relatively lightweight characteristics associated with copolymer layers. Furthermore, the voltage applied to the PZT material for operating in continuous wave mode and resonating the transducer, as depicted in the drawings and as described herein, is quite different from that of the polymer layer.

The variation of parameters associated with the matching layer does not have a very serious effect on the power output curves. For example, when the thickness of polyurethane varies +/−30%, the peak output is reduced by 12/20% and peak frequency varies by −/+1%. Such is the case for FIGS. 12A–B.

While multi-region matching layer structures are illustrated in U.S. Pat. Nos. 4,507,582, 4,211,948, and 5,434,827, in these cases, the impedance of the layer closer to the transducer (i.e. high impedance) has an impedance which is close to that of the transducer material. The impedance of the region (i.e. layer) closer to the radiation water medium (low impedance), is close to that of water. The purpose behind these patents is to make the useful frequency band broader. Their basic premise is that the transducer material has high impedance while water is low impedance. To couple from high impedance to low impedance effectively without reflection, the conventional method is a gradual or step-wise change of impedance from high to low value. On the other hand, the present invention uses a structure of low impedance material, which can be lower than the transducer's material impedance and is in contact with the transducer body. A high impedance material is at the outside, and as a result, the frequency band becomes narrower and output power increases.

Conventionally known material for impedance matching (single layer) for PZT (for wideband purposes) is aluminum ($17\times10^6$ $Kg/m^2s$). Pyrex glass and other type glass for optical use and for windows, etc., fuzed quartz, have impedances of about ~$13\times10^6$ $Kg/m^2s$. Plexiglass (acrylic) has a value of $3.2\times10^6$ $Kg/m^2s$, while polyester (Mylar), $3.4\times10^6$ $Kg/m^2s$. These have impedances higher than that of water ($1.5\times10^6$ $Kg/m^2s$) and lower than that of PZT ($36\times10^6$ $Kg/m^2s$) or PVDF-TrFE copolymer ($4.3\times10^6$ $Kg/m^2sec$).

The examples of radiation medium shown so far are liquid or typically water, but ultrasonic waves are sometimes launched into solids. In such cases, a similar structure can still be used.

Although the invention has been described in a preferred form with a certain degree of particularity, it is understood that the present disclosure of the preferred form has been made only by way of example, and that numerous changes in the details of construction and combination and arrangement of parts may be made without departing from the spirit and scope of the invention as hereinafter claimed. It is intended that the patent shall cover by suitable expression in the appended claims, whatever features of patentable novelty exist in the invention disclosed.

What is claimed is:

1. A resonant type transducer comprising:

a vibrator body comprising piezoelectric or electrostrictive material having a first acoustic impedance associated with a resonant frequency;

a matching layer coupled to said vibrator body and having a second acoustic impedance;

said matching layer acoustically matching said piezoelectric or electrostrictive vibrator to a radiation medium contacting said matching layer, said radiation medium having a third acoustic impedance;

wherein said second acoustic impedance associated with said matching layer is less than said third acoustic impedance associated with said radiation medium and greater than said first impedance associated with said resonance frequency of said vibrator body.

2. The transducer according to claim 1, wherein said transducer is an ultrasonic transducer operative in a continuous wave (CW) mode.

3. The transducer according to claim 1, wherein the vibrator body has a thickness of approximately one half the wavelength of the resonance frequency.

4. The transducer according to claim 1, wherein the radiation medium is a liquid or a solid.

5. The transducer according to claim 1, wherein the radiation medium is water.

6. The transducer according to claim 1, wherein the vibrator body comprises a piezoelectric or electrostrictive ceramic.

7. The transducer according to claim 1, wherein the vibrator body comprises a piezoelectric or electrostrictive crystal structure.

8. The transducer according to claim 1, wherein the vibrator body comprises a piezoelectric or electrostrictive polymer film.

9. The transducer according to claim 1, wherein the acoustic impedance of the vibrator body at resonance is less than the acoustic impedance of the vibrator body at non-resonant frequencies.

10. The transducer according to claim 1, wherein the matching layer comprises a material selected from the group consisting of: polyurethane, polybutadiene and polychloroprene material.

11. The transducer according to claim 1, wherein the matching layer comprises a rubber material.

12. The transducer according to claim 1, wherein the matching layer comprises a polymer material having bubble inclusions.

13. The transducer according to claim 1, further comprising a pair of electrodes, each respectively coupled at a corresponding surface of said vibrator body for applying an electromotive force to said body to excite acoustic signals in said piezoelectric or electrostrictive vibrator body.

14. The transducer according to claim 1, wherein the matching layer contacts said vibrator body at a first surface of said body, and wherein a metal reflective layer is disposed at a second surface of said body opposite said first surface.

15. The transducer according to claim 1, wherein the vibrator body comprises a first polymer material layer bonded to a second layer of polymer material.

16. The transducer according to claim 15, wherein the first polymer material layer comprises PVDF or its copolymer material.

17. The transducer according to claim 16, wherein the second polymer material layer comprises a polyester material.

18. A resonant type tranducer providing a narrowband, high output or high sensitvity signal to a radiation medium, said resonant transducer comprising:

a vibrator body comprising piezoelectric or electrostrictive material having a first acoustic impedance associated with a resonant frequency; and a matching layer for acoustically matching said vibrator body at resonance to said radiation medium, said matching layer comprising:

a first layer of material of thickness t1 and acoustic impedance Z1 and having an inner surface coupled to a front surface of said vibrator body; and a second layer of material of thickness t2 and acoustic impedance Z2 and having an outer surface coupled to said radiation medium, wherein the acoustic impedance Z2 is greater than the first acoustic impedance Z1 so as to provide a combined impedance of the matching layer at the front surface of the vibrator body which is less than the acoustic impedance of the radiation medium.

19. The resonant transducer according to claim 18, wherein said thickness t2 is less than one quarter of the wavelength of the resonant frequency.

20. The resonant transducer according to claim 18, wherein said thickness t1 is approximately one eighth to three quarters of the wavelength of the resonant frequency.

21. The resonant transducer according to claim 18, wherein second layer acoustic impedance Z2 is greater than that of said radiation medium.

22. The resonant transducer according to claim 18, wherein the radiation medium is water.

23. The resonant transducer according to claim 18, wherein:

said first layer comprises a material selected from the group consisting of: polyurethane, polybutadiene, polyisoprene, polychloroprene, silicon rubber, and soft polyethylene; and, said second layer comprises a material selected from the group consisting of: mylar, polyester, polystyrene, polyimide, polyethersulfer, metal and glass.

24. A method of forming a resonance transducer, said method comprising:

providing a piezoelectric body having a first acoustic impedance indicative of material characteristics of said piezoelectric body;

providing a propagation medium having a second acoustic impedance; and coupling a matching layer between said piezoelectric body and said propagation medium, wherein said piezoelectric body vibrating at the resonance frequency has a resonance impedance less than said second acoustic impedance associated with said propagation medium, and wherein said matching layer has a third acoustic impedance less than said second acoustic impedance associated with said propagation medium for providing a high output or high sensitivity signal to said medium when operated at the resonance frequency.

25. The method according to claim 24, wherein the step of coupling a matching layer between said piezoelectric body and said propagation medium comprises providing a first layer of material of thickness t1 and acoustic impedance Z1 and having an inner surface coupled to a front surface of said vibrator body and a second layer of material of thickness t2 and acoustic a vibrator body comprising piezoelectric or electrostrictive material having a first acoustic impedance associated with a resonant frequency;

a matching layer coupled to said vibrator body and having a second acoustic impedance;

said matching layer acoustically matching said piezoelectric or electrostrictive vibrator to a radiation medium contacting said matching layer, said radiation medium having a third acoustic impedance, wherein said second acoustic impedance associated with said matching layer is less than said third acoustic impedance associated with said radiation medium and greater than said first ipdance associated with said resonance frequency of said vibrator body.

26. A resonant type transducer for producing and/or detecting ultrasound energy in an adjacent radiation medium, said radiation medium having an acoustic impedance associated therewith, said transducer comprising:

a vibrator body comprising piezoelectric or electrostrictive material and having a first impedance associated with a resonance frequency that is less than that of said acoustic impedance of said radiation medium, said vibrator body having a front surface and a rear surface;

a backing layer disposed at said rear surface of said vibrator body for absorbing ultrasound energy from the vibrator body; and a matching layer having a first surface coupled to said front surface of said vibrator body and a second surface coupled to said radiation medium for communicating ultrasound energy therebetween, wherein said matching layer has an acoustic impedance less than the acoustic impedance of the radiation medium and greater than sad first impedance at said resonance frequency of said vibrator body.

27. The transducer according to claim 26, wherein the vibrator body is responsive a continuous wave signal to operate at said resonance frequency.

28. A resonant type transducer for producing and/or detecting ultrasound energy in an adjacent radiation medium, said radiation medium having an acoustic impedance associated therewith, said transducer comprising:

a vibrator body comprising piezoelectric or electrostrictive material and having a first impedance associated with a resonance frequency that is less than that of said acoustic impedance of said radiation medium said vibrator body having a front surface through which ultrasound energy is transferred to said radiation medium;

a backing layer disposed at said rear surface of said vibrator body for absorbing ultrasound energy from the vibrator body; and a matching layer for acoustically matching said vibrator body at said resonance frequency to said radiation medium said matching layer comprising:

a first layer of material of thickness t1 and acoustic impedance Z1, said first layer having a first surface coupled to said front surface of said vibrator body, and a second surface;

a second layer of material of thickness t2 and acoustic impedance Z2 greater than Z1, said second layer having a first surface coupled to said second surface of said fis layer, and a second surface coupled to said radiation medium, wherein said first and second layers are adapted to provide an effective impedance of the matching layer at the front surface of said vibrator body that is less than the acoustic impedance of the radiation medium and greater that of said vibrator body impedance at said resonance frequency.

29. The transducer according to claim 28, wherein said radiation medium is a liquid.

30. The transducer according to claim 28, wherein said radiation medium is water.

31. The transducer according to claim 28, wherein said radiation medium is a solid.

32. The transducer according to claim 28, wherein the vibrator body is responsive to a continuous wave signal to operate at said resonance frequency.

* * * * *

UNITED STATES PATENT AND TRADEMARK OFFICE

CERTIFICATE OF CORRECTION

PATENT NO. : 6,307,302 B1
DATED : October 23, 2001
INVENTOR(S) : Toda

It is certified that error appears in the above-identified patent and that said Letters Patent is hereby corrected as shown below:

Please cancel claims 24 and 25.

Signed and Sealed this

Thirtieth Day of March, 2004

JON W. DUDAS
*Acting Director of the United States Patent and Trademark Office*